US012078694B2

(12) United States Patent
Ghadiali et al.

(10) Patent No.: US 12,078,694 B2
(45) Date of Patent: Sep. 3, 2024

(54) SENSOR-BASED TAMPER DETECTION FOR MOUNTED ELECTRONIC DEVICES

(71) Applicant: Google LLC, Mountain View, CA (US)

(72) Inventors: Aditya Shailesh Ghadiali, Mountain View, CA (US); William Alan Saperstein, San Carlos, CA (US)

(73) Assignee: Google LLC, Mountain View, CA (US)

( * ) Notice: Subject to any disclaimer, the term of this patent is extended or adjusted under 35 U.S.C. 154(b) by 123 days.

(21) Appl. No.: 17/624,967

(22) PCT Filed: Jul. 29, 2020

(86) PCT No.: PCT/US2020/044049
§ 371 (c)(1),
(2) Date: Jan. 5, 2022

(87) PCT Pub. No.: WO2021/021918
PCT Pub. Date: Feb. 4, 2021

(65) Prior Publication Data
US 2022/0268860 A1 Aug. 25, 2022

Related U.S. Application Data

(60) Provisional application No. 62/880,625, filed on Jul. 30, 2019.

(51) Int. Cl.
*G01R 33/038* (2006.01)
*G01D 5/14* (2006.01)
(Continued)

(52) U.S. Cl.
CPC .......... *G01R 33/038* (2013.01); *G01D 5/145* (2013.01); *G01R 33/072* (2013.01);
(Continued)

(58) Field of Classification Search
CPC ........ H04W 4/38; G01D 5/145; G01D 11/245
See application file for complete search history.

(56) References Cited

U.S. PATENT DOCUMENTS 8,934,226 B2 * 1/2015 Smith ................... G06F 1/1613
361/679.2
10,062,249 B1 * 8/2018 Modi ................... G08B 29/046
(Continued)

FOREIGN PATENT DOCUMENTS

EP 2043067 4/2009
EP 3557552 10/2019
(Continued)

OTHER PUBLICATIONS

"International Preliminary Report on Patentability", Application No. PCT/US2020/044049, Feb. 1, 2022, 9 pages.
(Continued)

*Primary Examiner* — Jermele M Hollington
*Assistant Examiner* — Temilade S Rhodes-Vivour
(74) *Attorney, Agent, or Firm* — Colby Nipper PLLC

(57) ABSTRACT

An electronic device including a mounting device configured to couple to a surface, a head removably coupled to the mounting device and including a housing, a magnet attached to the mounting device, and a sensor disposed within the housing. The sensor detects a magnetic field associated with the magnet when the head is in a first position relative to the mounting device and detects the magnetic field associated with the magnet when the head is in a second position relative to the mounting device, the second position being different than the first position.

20 Claims, 7 Drawing Sheets

(51) Int. Cl.
   *G01R 33/07* (2006.01)
   *G08B 13/14* (2006.01)
   *G08B 13/196* (2006.01)
   *H04N 23/50* (2023.01)
   *H04N 23/667* (2023.01)

(52) U.S. Cl.
   CPC ..... *G08B 13/149* (2013.01); *G08B 13/19632* (2013.01); *H04N 23/50* (2023.01); *H04N 23/667* (2023.01)

(56) References Cited

U.S. PATENT DOCUMENTS

| | | | |
|---|---|---|---|
| 10,352,496 | B2 | 7/2019 | Mehdi et al. |
| 10,401,710 | B2 | 9/2019 | Wilson et al. |
| 2008/0143525 | A1 | 6/2008 | Woodbury et al. |
| 2011/0079138 | A1* | 4/2011 | Storrie ............... G01B 7/14 91/1 |
| 2014/0160250 | A1 | 6/2014 | Pomerantz et al. |
| 2015/0022618 | A1* | 1/2015 | Siminoff ............ H04N 21/4424 348/14.02 |
| 2016/0083990 | A1* | 3/2016 | Ricks ................ E05D 11/00 16/223 |
| 2017/0031235 | A1 | 2/2017 | Kubotera et al. |
| 2018/0293860 | A1* | 10/2018 | Britton, Jr. .......... G08B 21/182 |
| 2019/0004401 | A1 | 1/2019 | Wilson et al. |
| 2019/0230259 | A1 | 7/2019 | Germe et al. |
| 2023/0031426 | A1 | 2/2023 | Kraz et al. |

FOREIGN PATENT DOCUMENTS

| | | |
|---|---|---|
| KR | 20180019449 | 2/2018 |
| WO | 2014138776 | 9/2014 |
| WO | 2014201510 | 12/2014 |
| WO | 2021021918 | 2/2021 |
| WO | 2023277933 | 1/2023 |

OTHER PUBLICATIONS

"International Search Report and Written Opinion", Application No. PCT/US2021/044197, Apr. 4, 2022, 11 pages.

"International Preliminary Report on Patentability", Application No. PCT/US2021/044197, Jan. 31, 2023, 8 pages.

"International Search Report and Written Opinion", Application No. PCT/US2020/044049, Nov. 19, 2020, 12 pages.

"Non-Final Office Action", U.S. Appl. No. 17/815,058, Apr. 3, 2024, 15 pages.

\* cited by examiner

SENSOR-BASED TAMPER DETECTION FOR MOUNTED ELECTRONIC DEVICES

CROSS-REFERENCE TO RELATED APPLICATIONS

This application is a national stage entry of International Application No. PCT/US2020/044049, filed Jul. 29, 2020, which in turn claims the benefit of U.S. Provisional Patent Application No. 62/880,625, filed Jul. 30, 2019, which are incorporated by reference herein in their entireties.

This application is related to U.S. patent application Ser. No. 15/606,888, filed May 26, 2017, which is now U.S. Pat. No. 10,352,496, issued on Jul. 16, 2019, and U.S. patent application Ser. No. 15/710,758, filed Sep. 20, 2017, which is now U.S. Pat. No. 10,401,710 issued on Sep. 3, 2019, each of which is hereby incorporated by reference in its entirety.

This application is related to U.S. patent application Ser. No. 15/606,888, filed May 26, 2017, now U.S. Pat. No. 10,352,496, entitled "Stand Assembly for an Electronic Device Providing Multiple Degrees of Freedom and Built-in Cables," U.S. patent application Ser. No. 15/710,758, filed Sep. 20, 2017, now U.S. Pat. No. 10,401,710 entitled "Mount Hinge for an Electronic Device," each of which is hereby incorporated by reference in its entirety.

TECHNICAL FIELD

The present disclosure relates to a sensor for use in a mount for an electronic device including, but not limited to, a mount for a security camera module.

BACKGROUND

Usage of video cameras for surveillance or other tasks in residential and commercial environments has increased substantially, in part due to lower costs, the prevalence of sophisticated mobile devices having remote monitoring and control capabilities, and the increased availability of connectivity bandwidth. As consumer demands change and the complexity of security and related systems increases, various new challenges arise in designing such camera products.

Many security cameras, for example, need to be affixed to a surface to ensure stability, however these cameras are physically out in the public and thus can be tampered with or removed. For instance, a camera may be mounted outside of a commercial or residential building and may be adjusted or removed to allow an individual to remain hidden. This can allow individuals to enter a property without being detected, thereby negating the intended purpose of the security camera.

SUMMARY

Implementations described herein are directed to an electronic device including a mounting device configured to couple to a surface, a head removably coupled to the mounting device, the head including a housing, a magnet attached to the mounting device, and a sensor disposed within the housing, the sensor detecting a first magnetic field strength value associated with the magnet when the head is in a first position relative to the mounting device and detecting a second magnetic field strength value associated with the magnet when the head is in a second position relative to the mounting device, the second position being different than the first position.

In some implementations, the sensor is configured to detect a magnetic field strength value associated with a magnetic field of Earth and configured to detect a change in the magnetic field strength value associated with the magnetic field of the Earth based on movement of the head.

In some implementations, the electronic device further includes a camera module disposed within the housing.

In some implementations, the sensor is configured to detect changes in the magnetic field in multiple axes. The sensor may be one of a magnetometer, a magnetoresistive sensor, and a Hall effect sensor.

In some implementations, the electronic device further includes a speaker communicatively coupled to the sensor, wherein the speaker outputs an audio signal based on a change in the first magnetic field strength values associated with the magnet.

In some implementations, the magnet assists in removably coupling the head to the mounting device. The magnet may be configured to at least partially couple the mounting device to a surface. The first magnetic field strength value associated with the head in the first position and the second magnetic field strength value associated with the head in the second position may each be non-zero values.

In some implementations, the electronic device further includes an accelerometer disposed in the housing. The housing may be pivotable relative to the mounting device. The housing may be hingedly coupled to a stand, which may be coupled to the mounting device. The stand may be configured to allow the housing to move relative to the stand and the mounting device in at least two degrees of freedom.

In some implementations, the sensor is configured to detect the first magnetic field strength value at a frequency greater than 10 Hz. The sensor may be configured to notify an end user when the second magnetic field strength value deviates from the first magnetic field strength value by a predetermined amount.

Another implementation described herein is directed to a security camera including a camera module, a mounting plate configured to couple to a surface, a base assembly coupled to the mounting plate, a head including a housing, the housing containing the camera module, the housing rotatably and pivotably coupled to the base assembly, a magnet coupled to the mounting plate, and a sensor disposed within the head, sensor configured to detect a first magnetic field strength value associated with the magnet when the head is in a first position relative to the mounting plate and configured to detect a second magnetic field strength value associated with the magnet when the head is in a second position relative to the mounting plate, the second position being different than the first position.

Another implementation described herein is directed to a method of detecting a tamper event associated with an electronic device having a head and a mounting device, the method including the steps of detecting, via a sensor disposed within the electronic device, a magnetic field strength value associated with a magnet when the head is in an initial position relative to the mounting device, obtaining, via the sensor, an initial baseline based on the magnetic field strength value when the head is in the initial position, and detecting, via the sensor, a deviation from the initial baseline based on movement of the head relative to the mounting device.

In some implementations, method further includes notifying an end user having application associated with the electronic device that the deviation has occurred. The method may also include detecting, via the sensor, the magnetic field strength value at a frequency greater than 10 Hz.

In some implementations, the method further includes detecting, via the sensor, a magnetic field strength value associated with a magnetic field of Earth and a change in the magnetic field strength value associated with the magnetic field of the Earth based on movement of the head. The method may also include notifying an end user only when the magnetic field strength value deviates from the initial baseline by a predetermined amount.

BRIEF DESCRIPTION OF THE DRAWINGS

For a better understanding of the various implementations described and shown herein, reference should be made to the Detailed Description of implementations below, in conjunction with the following drawings in which like reference numerals refer to corresponding parts throughout the figures.

DETAILED DESCRIPTION

Figure 1A:
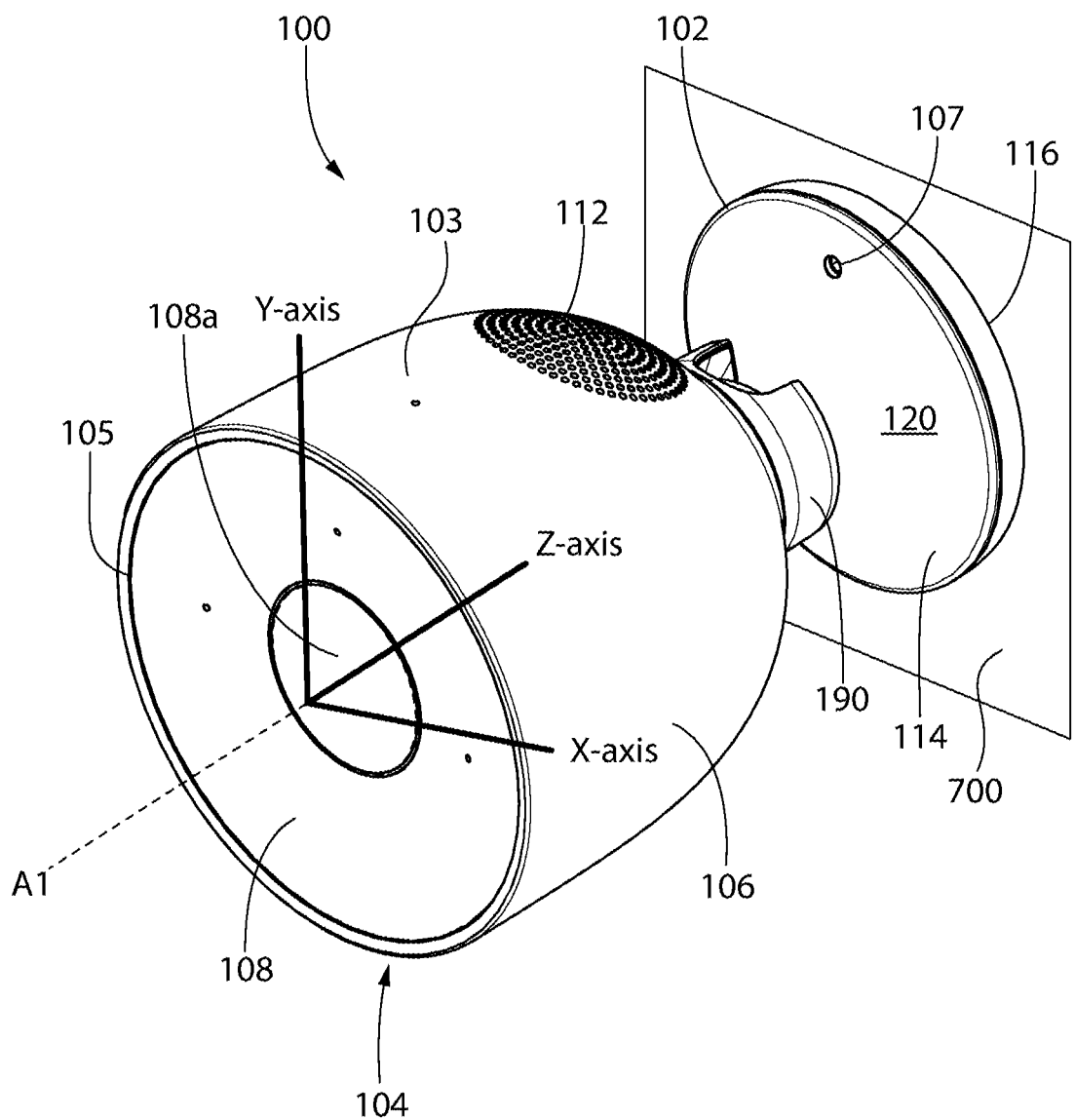
FIG. 1A is a perspective view of a system including an electronic device (e.g., a camera module) with a mount in accordance with some implementations.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Referring to the drawings in detail, wherein like reference numerals indicate like elements throughout, there is shown in FIGS. 1A-4 security system 100, which may be a camera system according to some implementations, which generally includes mounting plate 116 connected to head 104, which may include an electronic device. In some implementations, head 104 is or includes a camera module configured to capture video and/or still photographs. Head 104 may be coupled to a surface, such as surface 700, using a mounting device. In some implementations, the mounting device is mounting plate 116. In other implementations, the mounting device is stand 102. In yet another implementation, the mounting device is stand 102 coupled to mounting plate 116.

Referring to FIGS. 1A-3, head 104 may include stand 102, housing 106, front element 108, sensor 500, and accelerometer 600. Head 104 may be coupled to mounting plate 116 via stand 102, which may include base assembly 114. For example, housing 106 may be coupled to stand 102, which may be coupled to mounting plate 116. In some implementations, head 104 may be coupled directly to mounting plate 116. In some implementations, head 104 may be removably coupled to mounting plate 116 and/or stand 102. In one implementation, head 104 may be removably coupled to the stand 102 by, for example, a magnet.

In some implementations, security system 100 may be used, for example, as a component of a residential or commercial surveillance system. In some implementations, head 104 alternatively or additional includes one or more audio devices (e.g., speaker, microphone). In further implementations, head 104 additionally or alternatively includes a light source (e.g., light bulb, light emitting diode, laser, etc.). Other electronic devices may also be included in head 104 according to further implementations. In alternative implementations, security system 100 is primarily, or exclusively, a speaker, microphone, sensor, and/or light system.

Referring to FIGS. 1A-3, head 104, in some implementations, includes housing 106, which surrounds and protects the internal components of the electronic device. For example, housing 106 may protect the components stored within head 104. In some implementations where head 104 is or includes a camera module, the various components of the camera module (e.g., CPU(s), memory, data input device(s), data output device(s), lens assemblies, heat sink(s), image sensor array(s), infrared illuminator(s), filter(s), sensor(s) etc.) may be enclosed within housing 106. In some implementations, housing 106 may include a generally cup-shaped shell, which surrounds and defines an interior space in which the electronic device or components thereof may be housed. In some implementations, housing 106 may be bell-shaped or include a shape such as a circular paraboloid. Other shapes for housing 106 may also be utilized according to alternatively implementations. Housing 106 may have a continuously convexly curved exterior surface, which defines exterior surface 103 of head 104.

Referring to FIG. 1A, housing 106 may include a shape that is generally symmetric about central axis A1 of head 104. Head 104 may include a camera module having an optical axis, and central axis A1 of head 104 may be coaxial with an optical axis of the camera module. The optical axis of the camera module may refer to the axis about which the one or more lenses of the camera module are centered. In some implementations, head 104 further includes front element 108, which is sized and shaped to fit or substantially fill front end 105 of housing 106. Front element 108 may include central portion 108a. In some implementations, front element 108 and central portion 108a may both be circular and central portion 108a may be concentric with front element 108. In some implementations, front element 108 is secured to front end 105 of housing 106 with a water resistant or waterproof seal. In some implementations, where head 104 is or includes a camera module, front element 108 may be positioned at front end 105 of the camera module and be positioned to face a subject being videoed and/or photographed by the camera module during use. For example, in use camera module may have a field of view and when a subject is within the field of view, front end 105 may be positioned to face the subject. In further implementations, housing 106 includes a speaker and/or microphone grille 112 to allow transmission of sound to or from the electronic device disposed within in head 104.

In certain implementations, head 104 may include one or more lights (e.g., LEDs), which are configured to emit light through front element 108. In some implementations, the one or more lights may be configured to emit different colors that, for example, may be indicative of a status or operational mode of security system 100. In some implementations, the one or more lights are arranged to emit light proximate the perimeter of front element 108, for example, to produce a ring of light around central portion 108a of front element 108 or in response to an alert as discussed in further detail below. In some implementations, front element 108 may be configured to diffuse or soften the light emitted by the one or more lights. In some implementations, central portion 108a is configured to not diffuse or scatter light, and a portion of front element 108 around central portion 108a may be configured to diffuse or scatter light. Central portion 108a may be disposed about central axis A1 (e.g., coaxial with an optical axis of the camera) according to some implementations.

Referring to FIG. 1A, head 104 is configured to be affixed to surface 700 (e.g., building wall, ceiling, overhang, column, etc.) by mounting plate 116. In some implementations, mounting plate 116 can be affixed to surface 700. In some implementations, housing 106 of head 104 is configured to move relative to mounting plate 116. In some implementations, housing 106 is configured to move relative to mounting plate 116 in at least one degree of freedom. In some implementations, housing 106 is configured to move relative to mounting plate 116 in at least two degrees of freedom. In some implementations, housing 106 is configured to move relative to mounting plate 116 in three or at least three degrees of freedom. Housing 106 may be configured to be pivotably movable relative to mounting plate 116. In some implementations, housing 106 of head 104 may be configured to move relative to stand 102.

Figure 1B:
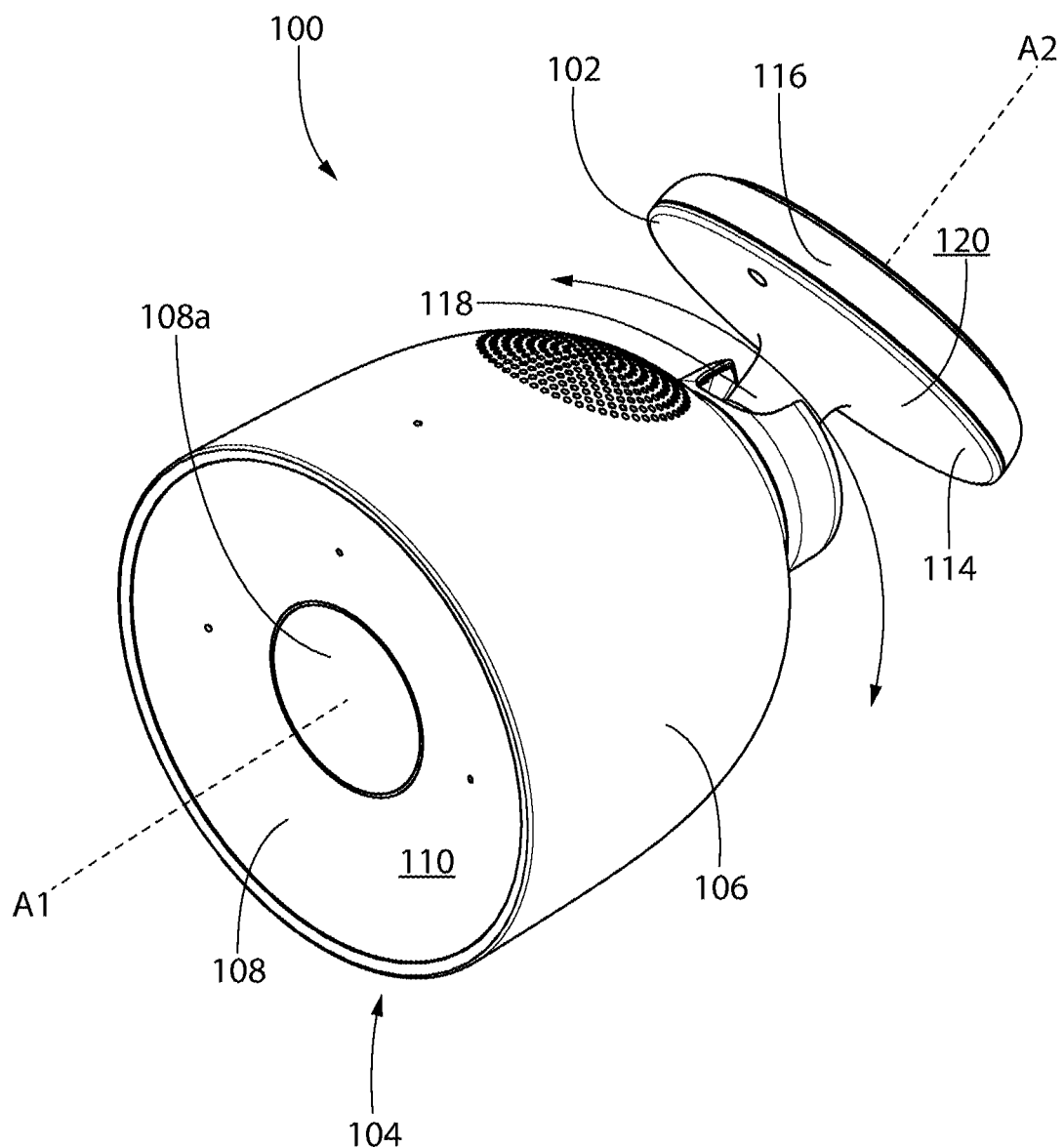
FIG. 1B is a perspective view of the system of FIG. 1A where the electronic device in a tilted positioned in accordance with some implementations.
Figure 1C:
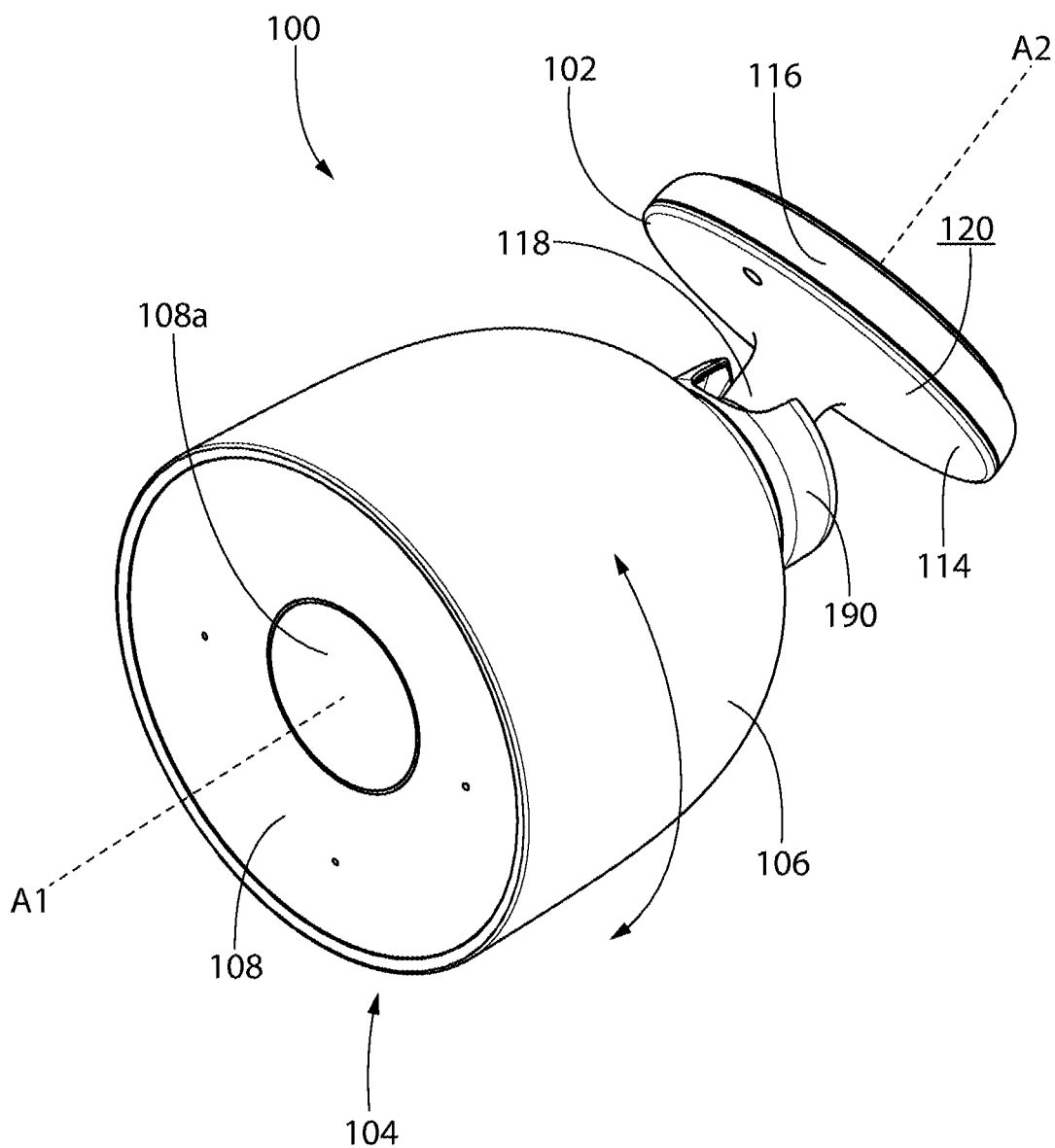
FIG. 1C is a perspective view of the system of FIG. 1A where the electronic device in a tilted and rotated positioned in accordance with some implementations.
Figure 4:
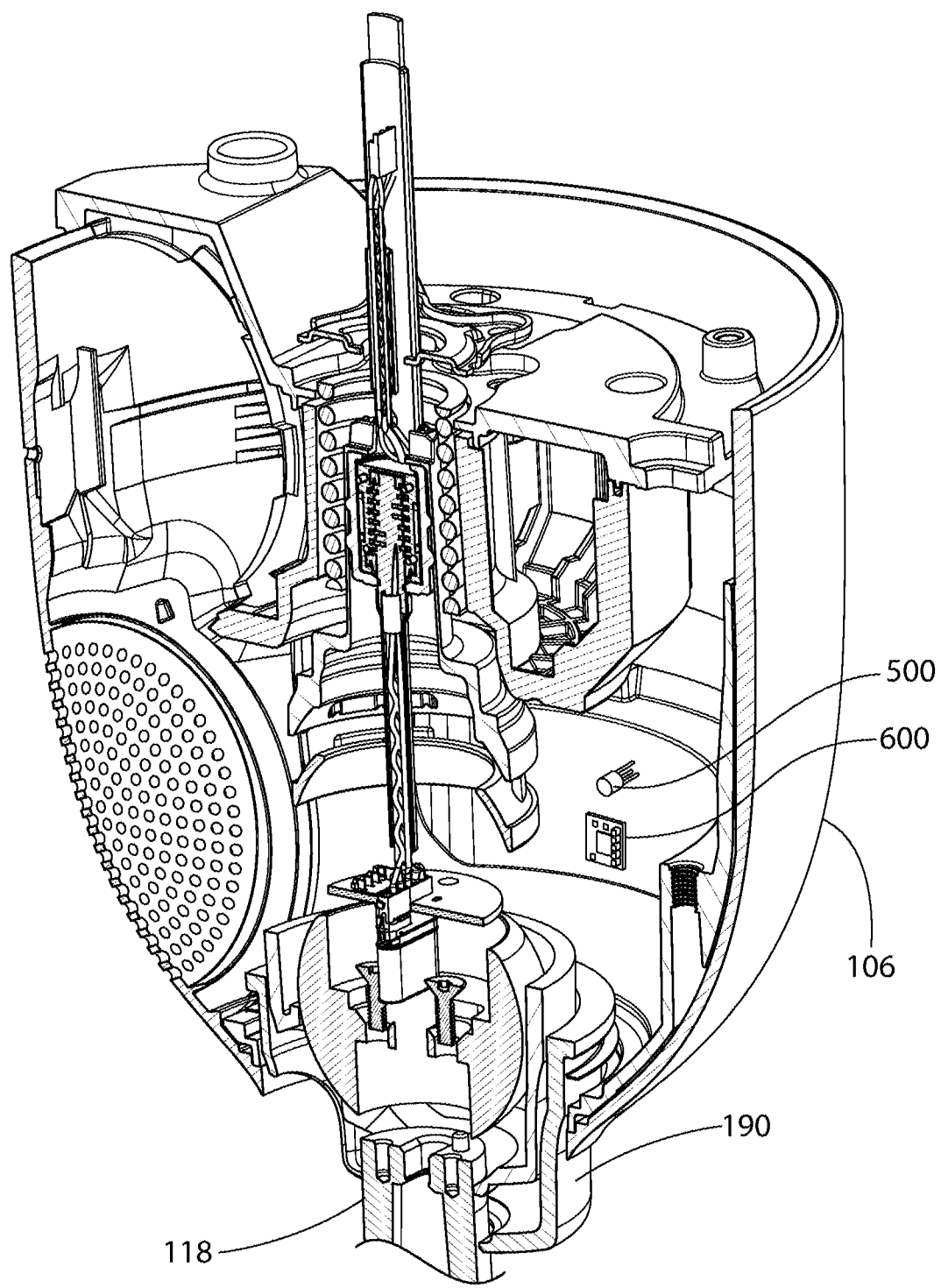
FIG. 4 is a partial exploded cutaway perspective side view of the system of FIG. 1A showing components of a hinge assembly in accordance with some implementations.

Referring to FIGS. 1B-1C and 4, stand 102 may include base assembly 114. In some implementations, base assembly 114 includes external surface 120 and stem 118, which extends from external surface 120. Housing 106 may be coupled to stand 102 via stem 118. Stem 118 may extend perpendicularly from a portion of external surface 120 (e.g., a central portion). Stem 118 may couple with housing 106 to form a hinge assembly. The hinge assembly formed by stem 118 and housing 106 may be a ball-and-socket joint. Stem 118 may couple to housing 106 such that housing 106 is selectably fixed relative to stem 118. In some implementations, stem 118 is coupled to housing 106 such that housing 106 is fixed relative to stem 118. In some implementations, stem 118 is coupled to housing 106 by a fastener or fastening device, such as a magnet. In some implementations, stem 118 is disposed about and extends along an axis A2. In some implementations, housing 106 is configured to tilt and/or rotate with respect to stem 118, as depicted by the arrows shown in FIG. 1B. In some implementations, housing 106 is configured to tilt with respect to stem 118 with a range of motion between 45° to 90°, 50° to 85°, 55° to 80°, 60° to 75°, or 65° to 70°. In some implementations, housing 106 may be coupled to collar 190. Housing 106 may be further configured to rotate relative to collar 190 about central axis A1 of housing 106 (e.g., clocking motion), as depicted by the arrows shown in FIG. 1C and as discussed in further detail below. As mentioned previously, where housing 106 includes a camera module, central axis A1 of housing 106 may be coaxial with the optical axis of the camera module. In some implementations, housing 106 may rotate about central axis A1 of housing 106 with no limit to the range of rotation.

Referring to FIG. 1A, base assembly 114 further includes a release mechanism that is configured to allow head 104 to be disengaged from mounting plate 116. In some implementations, the release mechanism requires a separate tool to actuate. In some implementations, the release mechanism may be accessed by a user through opening 107 in external surface 120 of base assembly 114. In some implementations, the release mechanism requires the separate tool to be inserted into opening 107 in order to be actuated, causing head 104 to disengage from mounting plate 116. In some implementations, the release mechanism requires a tool to be inserted into opening 166 and rotated. Similar to a security screw, opening 166 in some implementations may be shaped such that only a tool having a specific predetermined shape (e.g., specific cross-sectional shape) may fit in opening 166 and actuate the release mechanism. Requiring a specific shape for the tool, particularly a less common shape, may help prevent unauthorized removal of head 104 from mounting plate 116 according to some implementations. In some implementations, the release mechanism may be designed to require a wrench or driver having one of, for example, a hex, torx, square, triangular, pentalobe, polydrive, torq-set, or any other shape known for driving security screws. In some implementations, the tool is a hex key. In some implementations, opening 107 is configured such that a flathead or Phillips screwdriver will not be able to actuate the release mechanism.

Figure 2:
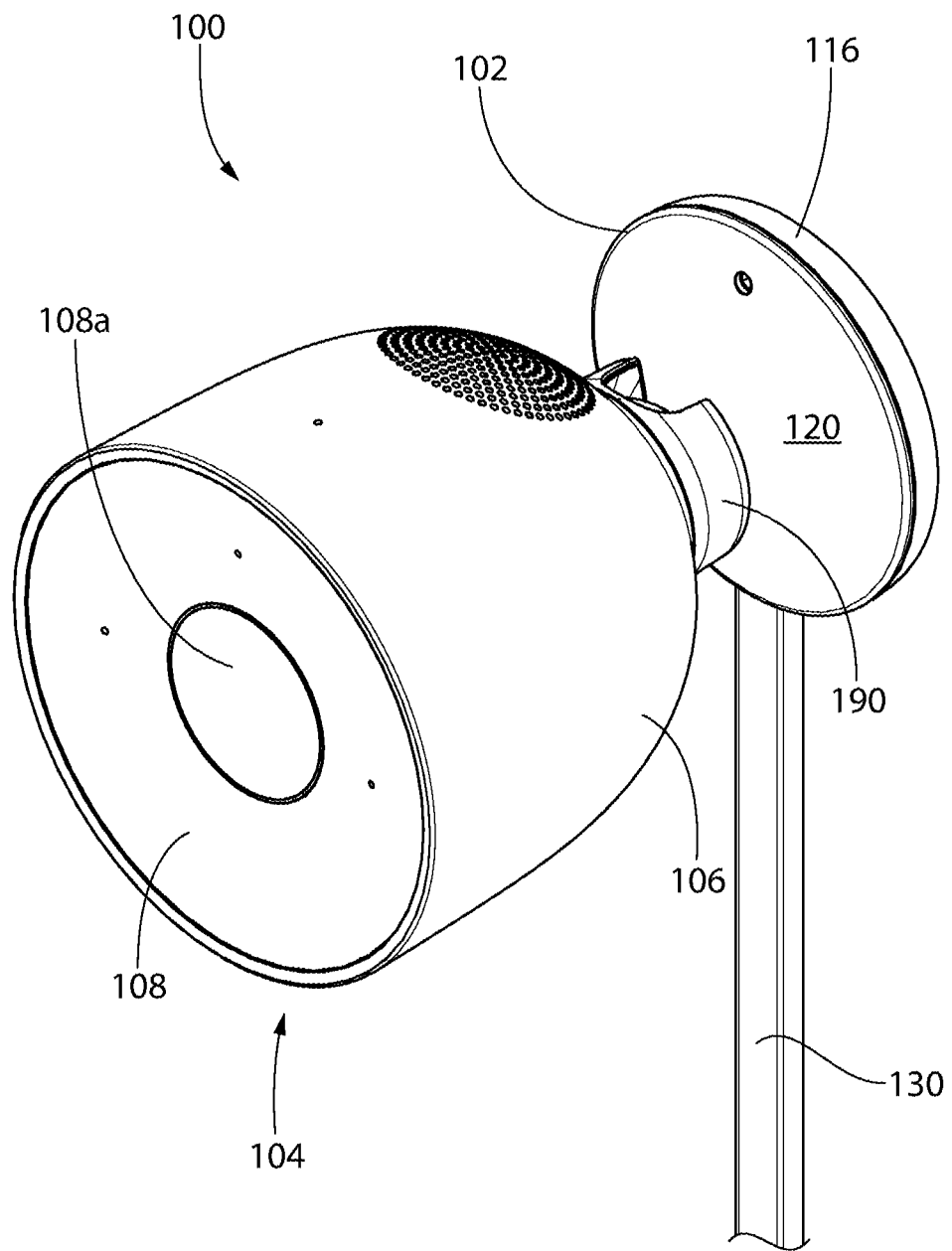
FIG. 2 is a perspective view of the system of FIG. 1A connected to a cable in accordance with some implementations.
Figure 3:
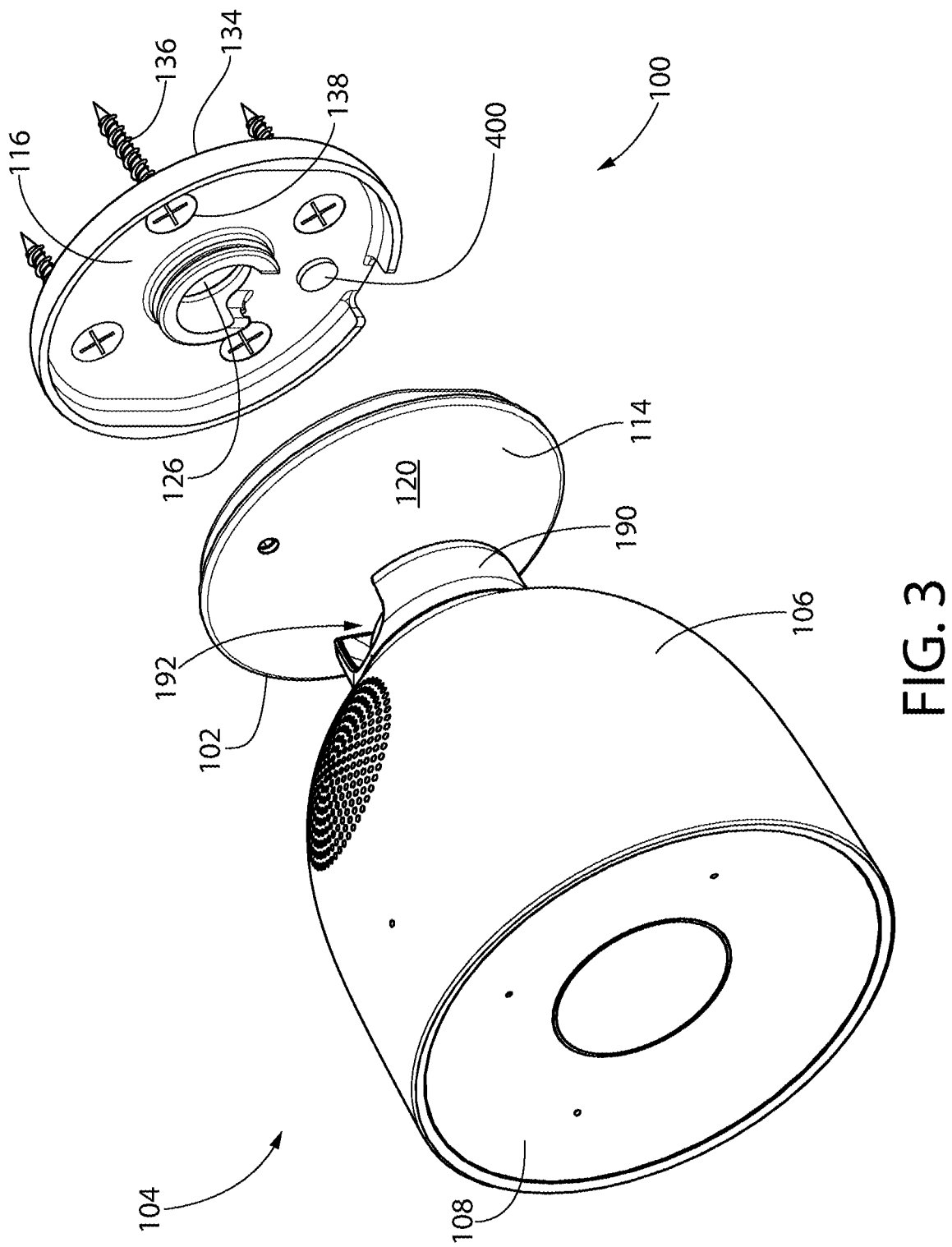
FIG. 3 is an exploded front perspective view of the system of FIG. 1A with the mounting plate separated from the base assembly and provided with fasteners in accordance with some implementations.

Referring to FIGS. 2 and 3, security system 100 may be configured to electronically connect with an external electronic device (not shown), which may be, for example, an electronic power source, computer, portable electronic device, component of a smart home network, etc. In some implementations, security system 100 is configured to communicate data with one or more smart devices, a central server or cloud-computing system, and/or other devices that are network-connected. In some such implementations, security system 100 is configured to electronically connect with the external electronic device through a wired connection (e.g., a USB cable) that passes through mounting plate 116 and into base assembly 114. The wired connection may allow both power and data transmission between the external electronic device and security system 100. In certain implementations, as will be described further herein, the connection of security system 100 to any cables may be concealed. In some implementations, concealing the cable may help protect the cables and prevent tampering and disablement of security system 100 during use. The cable of security system 100 may be covered by cable cover 130 to protect security system 100 from outdoor elements, such as weather, debris, or animals, or to protect the cable from tampering. In some implementations, the cable may pass through back opening 126 of mounting plate 116.

Referring to FIG. 1 A, security system 100 may be a wireless system such that a physical wired connection between security system 100 and the external device is not required. In some such implementations, security system 100 may include a self-contained battery or energy storage device (e.g., batter) capable of providing power to electronic components of security system 100. In further implementations, security system 100 includes modules for the wireless transmission of data to the external device. In some implementations, security system 100 is configured to wirelessly communicate data with one or more smart devices, a central server or cloud-computing system, and/or other devices that are network-connected. Data communications may be carried out using any of a variety of custom or standard wireless protocols (e.g., IEEE 802.15.4, Wi-Fi, ZigBee, 6LOWPAN, Thread, Z-Wave, Bluetooth, ISAlOO.1 1a, WirelessHART, MiWi, etc.) and/or any of a variety of custom or standard wired protocols (e.g., Ethernet, HomePlug, etc.), or any other suitable communication protocol.

Referring to FIGS. 1A and 3, mounting plate 116 may be secured to surface 700, which may be a wall, ceiling, or other location where security system 100 may be mounted before engagement with base assembly 114. In some implementations, stand 102 of head 104 may be configured to couple head 104 to mounting plate 116, thereby coupling head 104 to surface 700. Mounting plate 116 may include back surface 134, which may be positioned to abut against surface 700, such as a wall or other surface and may be secured thereto using one or more mechanical fasteners 136 (e.g., screws, nails, bolts, pins, etc.). Fasteners 136 may be received through one or more fastener holes 138 provided on mounting plate 116 which, for example, may be arranged around back opening 126. In some implementations, back opening 126 may be, but not necessarily, positioned centrally between two or more of fastener holes 138. Fasteners 136 may be, in some implementations, screws having heads which are configured to be concealed between mounting plate 116 and base assembly 114. In some implementations, back surface 134 may be provided or coated with an elastomeric material (e.g., silicone, rubber, etc.) that is configured to form a seal and/or provide for vibration absorption against the wall, ceiling, or other surface to which security system 100 is to be mounted. In some implementations, back surface 134 may be adhered or secured to the wall or other surface with any other suitable means known to those skilled in the art (e.g., via hook-and-loop fasteners, magnetic fasteners, etc.).

In some implementations, at least a portion of mounting plate 116 may be made of magnetically attractable material, which may be magnetically coupled to a magnetic surface to affix mounting plate 116 and security system 100 to the magnetic surface. In some implementations, mounting plate 116 may include one or more magnets (not shown) for attaching mounting plate 116 onto surface 700, which may be a certain magnetic or metal supporting surface. The magnet, according to some implementations, may be disposed adjacent to or may form a portion of mounting plate 116. In some implementations, the magnet includes a magnetic plate.

Referring particularly to FIGS. 3 and 4, in some implementations, security system 100 may include sensor 500 (FIG. 4) and magnet 400 (FIG. 3). The sensor 500 may be disposed within housing 106 of head 104 and may be configured to detect motion of the head 104 relative to the mounting plate 116. In some implementations, sensor 500 may disposed within stand 102 or on a bottom surface of base assembly 114. In practice, information regarding the movement of housing 106 and/or head 104 relative to mounting plate 116 is useful to verify whether housing 106 and/or head 104 have been re-positioned or tampered with by a potential intruder. For example, an intruder may remove head 104 from mounting plate 116, which may be affixed to surface 700, to prevent the camera module within housing 106 from recording their activity. The removal of head 104 may be detected by sensor 500. By way of another example, an intruder may rotate housing 106 of head 104 to reposition housing 106 to avoid recording activity within the original field of view of the camera module disposed within housing 106, thereby allowing the intruder and/or his/her associates to avoid being recorded. In yet another example, a potential intruder may remove head 104 from mounting plate 116, and then place head 104 back to its original position. The removal of head 104 may be detected by sensor 500 and relied to the owner, even though head 104 was returned to its original position. Sensor 500 may be used to indicate tampering of head 104 and may trigger a notification and/or action as discussed in further detail below. In some implementations, sensor 500 is disposed within housing 106 of head 104 adjacent collar 190 and stand 102. Sensor 500 may be coupled to an internal structure of head 104 by an adhesive, soldering, fasteners, or any other method of coupling sensor 500 to an internal structure of head 104.

In some implementations, magnet 400 (FIG. 3) is provided to add a strong magnetic field to enhance the sensitivity of the sensor 500. In some implementations, magnet 400 provides mounting purposes as well, as discussed above. Magnet 400 may be coupled to mounting plate 116 such that magnet 400 is disposed within mounting plate 116. Magnet 400 may be coupled to mounting plate 116, disposed within mounting plate 116, or disposed on mounting plate 116. Magnet 400 may be coupled to mounting plate 116 via an adhesive, fastener, or magnetic attraction. In some implementations, magnet 400 may be sized and shaped to fit within mounting plate 116, between fastener holes 138. Magnet 400 may be configured to generate a magnetic field having a value that does not affect or impair the functioning of other elements of security system 100, such as the camera module. In some implementations, multiple magnets similar to magnet 400 may be used, which may be disposed throughout mounting plate 116. In some implementations, mounting plate 116 may include multiple types of magnets. For example, mounting plate 116 may include one type of magnet for affixing mounting plate 116 to surface 700 and another type of magnet similar to magnet 400 for generating magnetic strength field values detected by sensor 500. In some implementation's, the magnet for affixing mounting plate 116 to surface 700 and the magnet or generating magnetic strength field values detected by sensor 500 are the same magnet.

In some implementations, sensor 500 may be disposed within housing 106 of head 104 and magnet 400 may be disposed within mounting plate 116. In alternative implementations, sensor 500 may be disposed within mounting plate 116 and magnet may be disposed within housing 106. Sensor 500 may be fixedly coupled to the interior of housing 106. In some implementations, sensor 500 may be configured to remain in a fixed location relative to housing 106 and/or head 104. Sensor 500 may be configured to detect magnetic field strength values generated by, for example, magnet 400. In some implementation, sensor 500 is a tamper detection sensor configured to detect various positions of head 104 relative to mounting plate 116. Sensor 500 may detect various positions of head 104 relative to mounting plate 116 based on magnetic field strength values generated by magnet 400 within mounting plate 116 and detected by sensor 500 based on the position of head 104 relative to mounting plate 116. For example, sensor 500 may detect translation of head 104 and/or rotation of housing 106 relative to mounting plate 116 based on changes to the magnetic field strength values generated by magnet 400 disposed within mounting plate 116.

In some implementations, security system 100 may include accelerometer 600, which may be an electronic compass. Accelerometer 600 may work in conjunction with sensor 500 and may provide acceleration information relating to the movement and acceleration of housing 106. Accelerometer 600 may be configured to detect repositioning of housing 106. In some implementations, accelerometer 600 may be a 3-axis accelerometer. In some implementations, accelerometer 600 may include a 3-axis gyroscope. In some implementations, accelerometer 600 may be a part of sensor 500. For example, sensor 500 may include a magnetometer, accelerometer 600, and the 3-axis gyroscope. Accelerometer 600 may be beneficial when sensor 500 and magnet 400 are aligned along the same axis. For example, when sensor 500 and 400 are aligned along the same axis, sensor 500 may not be able to determine changes in magnetic field strength values of magnet 400, thus may utilize accelerometer 600 to help determine whether housing 106 has moved relative to mount. In some implementations, accelerometer 600 may notify a user when the entirety of security system 100 has been moved or removed from surface 700. For example, removing the entirety of security system 100 may result in sensor 500 not detecting a change in magnetic field strength values from magnet 400 due to magnet 400 and sensor 500 not moving relative to one another. Thus, accelerometer 600 may be able to detect movement when the position of magnet 400 relative to sensor 500 is unchanged.

Further, existing sensors used for tamper detecting require an additional power source and can be expensive. For example, existing tamper prevention methods may utilize magnetic switches to determine whether a security camera has been tampered with. However, these magnetic switches only work along a single axis. Further, magnetic switches do not engage in all situations, thereby allowing for false negatives or may be manipulated by using an additional magnet to trick the sensor. In addition, some detectors for detecting tampering require compromising the industrial design. For example, some detectors require a viewing window or an optical sensor that requires apertures to be cut into the existing housing. This can be undesirable since it is necessary to know whether a device such as a security camera has been tampered with.

In some implementations, sensor 500 may be disposed in housing 106 and may be a 3-axis magnetometer to detect the strength of magnetic field with increased sensitivity. Sensor 500 may be disposed in housing 106 without compromising the industrial design of housing 106 or without the need for creating apertures or windows within housing 106. In some implementations, sensor 500 may be a Hall Effect sensor or a magnetoresistive sensor such as an anisotropic magnetoresistive sensor, a giant magnetoresistive sensor, or a tunneling magnetoresistive sensor. Sensor 500 may be a 3-axis sensor to provide greater sensitivity in detecting a change in the magnetic field strength through change in the position of head 104 relative to mounting plate 116. In some implementations, sensor 500 detects magnetic field vectors (field strength and direction). Sensor 500 may be configured to sense change in position of head 104 relative to mounting plate 116 based on changes in magnetic field strength values along the X-axis, Y-axis, and Z-axis (FIG. 1 A). In some implementations, sensor 500 alone, or sensor 500 in conjunction with accelerometer 600, may detect changes in position of head 104 based on acceleration information from accelerometer 600 and the orientation of sensor 500 relative to Magnetic North of Earth's magnetic field and/or relative to magnet 400. For example, sensor 500 may notify a user when the entirety of security system 100 has been moved or removed from surface 700. For example, removing the entirety of security system 100 may result in sensor 500 not detecting a change in magnetic field strength values from magnet 400 due to magnet 400 and sensor 500 not moving relative to one another. However, sensor 500 may be able to detect a change due to Earth's magnetic field when moved from an initial position, thus detecting when the position of security system 100 has altered.

In some implementations, a user may set an initial baseline value based on a magnet field strength value acquired by sensor 500 when head 104 is initially coupled to mounting plate 116, which is affixed to surface 700. In some implementations, sensor 500 may detect a magnetic field strength value at a specific frequency and compare this value to the initial baseline. For example, sensor 500 may detect a magnetic strength field value at frequency of 5 Hz for one second and compare this value to the initial baseline previously determined, as discussed below. In some implementations, sensor 500 may detect a magnetic strength field value at frequency of approximately 1 Hz, approximately 2 Hz, approximately 3 Hz, approximately 10 Hz, approximately 15 Hz, approximately 20 Hz, approximately 25 Hz, approximately 50 Hz, approximately 75 Hz, approximately 100 Hz, or greater than 100 Hz. In preferred implementations, sensor 500 may detect a magnetic strength field value at a frequency of 20 Hz.

In some implementations, sensor 500 may be calibrated to sense the position of sensor 500 within housing 106 relative to Earth's magnetic field. For example, when head 104 is in an initial position, after installation, sensor 500 may detect an initial magnetic field strength value based on Earth's magnetic field, such as Magnetic North, and may set this initial reading as the baseline for sensor 500. In some implementations, sensor 500 detects the baseline after approximately 6 hours, 12 hours, 24 hours, 36 hours, 48 hours, 60 hours, or 72 hours. When head 104 is removed from mounting plate 116 or substantially changes locations (i.e., removed from the surface that head 104 and mounting plate 116 are affixed to), sensor 500 may detect another magnetic field strength value based on Earth's magnetic field that is a deviation from the initial baseline. In some implementations, calibrating sensor 500 based upon Earth's magnetic field allows sensor 500 to detect when head 104 has changed positions. For example, an intruder may remove head 104 and sensor 500 from mounting plate 116, which removes power from head 104 and the camera module thereby resulting in security system 100 not being able to capture video. After the intruder has finished their activities, the intruder may place head 104 back onto mounting plate 116 in its original position. Due to sensor 500 detecting changes in magnetic field strength values relative to Earth's magnetic field, sensor 500 can detect that the position of head 104 has been tampered with.

In some implementations, sensor 500 and magnet 400 may be initially positioned to align with Magnetic North of Earth's magnetic field. In this implementation, sensor 500 being a 3-axis sensor allows sensor 500 to rely primarily on the deviation of the magnetic field strength of magnet 400 along the X-axis, Y-axis, and Z-axis to determine movement of head 104, instead of relying solely on the detection of Earth's magnetic field by sensor 500. In some implementations, once head 104 is decoupled from mounting plate 116, sensor 500 may no longer detect magnetic field strength values until head 104 has been re-coupled to mounting plate 116.

In some implementations, sensor 500 may have a sensitivity to detect movement of head 104 away from mounting plate 116 at various distances. For example, sensor 500 may detect when head 104 is moved at least 0.1 cm, 0.2 cm, 0.3 cm, 0.4 cm, 0.5 cm, 0.6 cm, 0.7 cm, 0.8 cm, 0.9 cm, 1 cm, 2 cm, 3 cm, 5 cm, or 10 cm away from mounting plate 116. In preferred implementations, sensor 500 may detect when head 104 is moved at least 0.75 cm. In some implementations, sensor 500 may have a sensitivity to detect rotation of housing 106 of head 104 relative mounting plate 116 at various degrees of rotation. For example, sensor 500 may detect when housing 106 has been rotated at least 5°, 6°, 7°, 8°, 9°, 10°, 15°, 30°, 35°, 40°, or 45° about the X-axis, Y-axis, and Z-axis relative to mounting plate 116. In preferred implementations, sensor 500 may detect when housing 106 is rotated at least 10° relative to mounting plate 116.

In some implementations, sensor 500 and the magnet 400 are mutually configured and dimensioned such that the sensor 500 can detect a change in orientation of sensor 500 relative to magnet 400. In some implementations, head 104 is directly coupled to mounting plate 116 via a magnet. In some implementations, magnet 400 may be the same magnet that is used to couple head 104 to mounting plate 116 or the same magnet used to couple mounting plate 116 to surface 700 for affixing mounting plate 116 to surface 700. In some implementations, magnet 400 may be the same magnet used to couple head 104 to stand 102.

In some implementations, magnet 400 may be a rare earth metal. In some implementations, the thickness and diameter of magnet 400 may be determined based on the strength of the magnetic field of magnet 400 desired. Magnet 400 may generate a strong magnetic field having a specific strength, which may be detected by sensor 500. Magnet 400 generating a strong magnetic field allows sensor 500 to operate with increased sensitivity due to smaller changes in the magnetic field strength values of magnet 400 being more detectable by sensor 500. In some implementations, sensor 500 being a 3-axis sensor results in sensor 500 detecting the magnetic field strength value along the X-axis, Y-axis, and Z-axis, thereby obtaining three magnetic field strength values for the reading of the magnetic field strength value of each of the X-axis, Y-axis, and Z-axis.

In some implementations, when head 104 is initially coupled to mounting plate 116 in an initial position, sensor 500 may determine an initial orientation baseline based on the position of sensor 500 relative to magnet 400. Sensor 500 may determine the initial orientation baseline based on the magnetic field strength value of magnet 400 detected by sensor 500. In some implementations, sensor 500 may determine the initial orientation baseline after approximately 1 minute, 2 minutes, 3 minutes, 5 minutes, 10 minutes, 30 minutes, or 60 minutes. In some implementations, rotation of housing 106 of head 104 causes rotation of sensor 500 relative to magnet 400, thereby changing the value of the magnetic field strength value detected by sensor 500 compared to the initial orientation baseline value. The change in the value of the magnetic field strength may occur in the X-axis, the Y-axis, or the Z-axis, thereby allowing sensor 500 to determine the manner in which housing 106 was rotated relative to magnet 400. In some implementations, sensor 500 may primarily rely on the change in orientation of sensor 500 relative to magnet 400 when head 104 is coupled to mounting plate 116. When head 104 is decoupled from mounting plate 116, sensor 500 may not be able to detect the magnetic field strength value of magnet 400, thus must rely on the change in the magnetic field strength value of Earth's magnetic field.

In some implementations, upon detecting of the deviation from the initial baseline, sensor 500 may initiate an alarm to indicate that head 104 has been tampered with. In some implementations, sensor 500 may output an audio signal via a speaker disposed in housing 106 or flash a bright light via a light source coupled to or disposed within housing 106. For example, when sensor 500 detects a magnetic field strength value that is a deviation from the initial baseline, sensor 500 may cause the speaker to output an alarm, such as a 130 dB alarm sound, or cause housing 106 to turn on or flash a light. In some implementations, the speaker may output an alarm sound having a decibel level between approximately 30 dB and approximately 150 dB, between approximately 60 dB and approximately 120 dB, or approximately 80 dB and approximately 100 dB. Sensor 500 may initiate the alarm to notify the owner that an intruder has tampered with head 104. In some implementations, upon detecting of the deviation from the initial baseline, sensor 500 may notify a user via an application associated with security system 100 that is stored on an electronic device of the user.

In some implementations, sensor 500 may only initiate the alarm after a threshold has been reached. For example, sensor 500 may only output an audio signal or flash a light when sensor 500 detects a deviation from the initial baseline at a certain value, such as head 104 being 0.5 cm from mounting plate 116 or housing 106 being rotated at least 5° relative to mounting plate 116. This is to ensure that slight movement of head 104 or rotation of housing 106 does not result in an alarm sound. In some implementations, sensor 500 may include various thresholds based on the noise floor of sensors currently available. For example, sensor 500 may have a low threshold, such as approximately 0.1 inches or approximately 5°, a medium threshold, such as approximately 1 inch or approximately 7°, and a high threshold, such as 3 approximately inches or approximately 15°. In some implementations, sensor 500 may have thresholds between the low threshold, the medium, threshold, and the high threshold. For example, sensor 500 may have a threshold between approximately 0.1 inches to approximately 5 inches, approximately 5 inches to approximately 10 inches, or approximately 7 inches to approximately 15 inches and may have a threshold between approximately 5° to approximately 15°, approximately 10° to approximately 35°, approximately 20° to approximately 45°.

In some implementations, when sensor 500 detects a deviation greater than the low threshold, sensor 500 may notify the owner of the deviation via the application associated with security system 100. When sensor 500 detects a deviation greater than the medium threshold, sensor 500 may notify output audio signal to the speaker to sound an alarm and/or flash a bright light. When sensor 500 detects a deviation greater than the high threshold, sensor 500 may notify the owner and the authorities that an intruder has tampered with head 104. In some implementations, security system 100 may be communicatively coupled to surrounding cameras such that when sensor 500 detects a deviation from a threshold value, the surrounding cameras rotate such that their field of view captures the field of view of security system 100. In some implementation, sensor 500 may detect motion of head 104 based on a magnetic field strength value that is below a threshold value. When the magnetic field strength value that is detected is below the threshold value, sensor 500 may associate a timestamp with the recorded video at the timestamp, and may mark the video recording at the timestamp to indicate motion below the threshold value was detected by sensor 500.

In some implementations, the user may use an application associated with security system 100 to activate or deactivate sensor 500 and accelerometer 600. For example, the user may desire that they do not want to be notified about tamper events detected by security system 100, and thus may deactivate sensor 500 and accelerometer 600. When sensor 500 and accelerometer 600 are deactivated, the user will no longer be notified when sensor 500 detects deviations from an initial baseline or when accelerometer 600 detects acceleration. Further, when sensor 500 and accelerometer 600 are deactivated, alarms may not be initiated to notify the user about tamper events associated with security system 100.

In some implementations, a user may reset the initial baseline by re-positioning head 104 and/or rotating housing 106. In some implementations, this change in orientation is communicated from sensor 500 to one or more user interfaces using a variety of different electronics and communications configurations. In some implementations, removal of head 104 may result in the camera module being turned off due to the camera module being disconnected from a power source. In other implementations, the camera within housing 106 may be coupled to a battery disposed within housing 106. When sensor 500 detects substantial movement of head 104, security system 100 may switch to the battery, such that removal of head 104 from mounting plate 116, does not cause the camera module to stop recording due to loss of power. The camera module being connected to the battery may allow the camera module to continue recording video and/or audio when head 104 has been removed from mounting plate 116. When head 104 is returned to mounting plate 116, the camera module disposed within housing 106 may turn back on and switch to its original power source to preserve the battery. In some implementations, the battery is rechargeable by the original power source.

In some implementations, sensor 500 may act as a switch sensor to detect detachment of head 104 from mounting plate 116. In some implementations, sensor 500 may detect a deviation from an initial magnetic field strength value of magnet 400, thereby indicating that head 104 has been removed from mounting plate 116. In some implementations, sensor 500 may detect that head 104 has been removed from mounting plate 116 by no longer detecting a magnetic field strength value associated with magnet 400. In some implementations, security system 100 may include an additional switch sensor to detect decoupling of head 104 from mounting plate 116. The additional switch sensor may be configured to detect when head 104 has been removed from mounting plate 116.

In some implementations, sensor 500 and magnet 400 may be used to indicate the position of head 104 relative to mounting plate 116. For example, sensor 500 may detect a deviation from the initial baseline based on an initial reading of the magnetic field strength value of magnet 400. This deviation detected by sensor 500 may indicate a deviation in position of head 104 relative to mounting plate 116 and thus a movement of head 104 from an original position to a different position, thereby indicating the degree to which housing 106 of head 104 has been rotated relative to mounting plate 116. In some implementations, sensor 500 may indicate the position of head 104 based on deviations from an initial baseline based on the magnetic field strength value of Earth's magnetic field. For example, sensor 500 may detect a deviation from an initial baseline based on the magnetic field of Earth. This deviation detected by sensor 500 may indicate movement of head 104 or rotation of housing 106 from an original position to a different position, thereby indicating the degree to which head 104 has been moved or housing 106 has been rotated relative to mounting plate 116.

Figure 5:
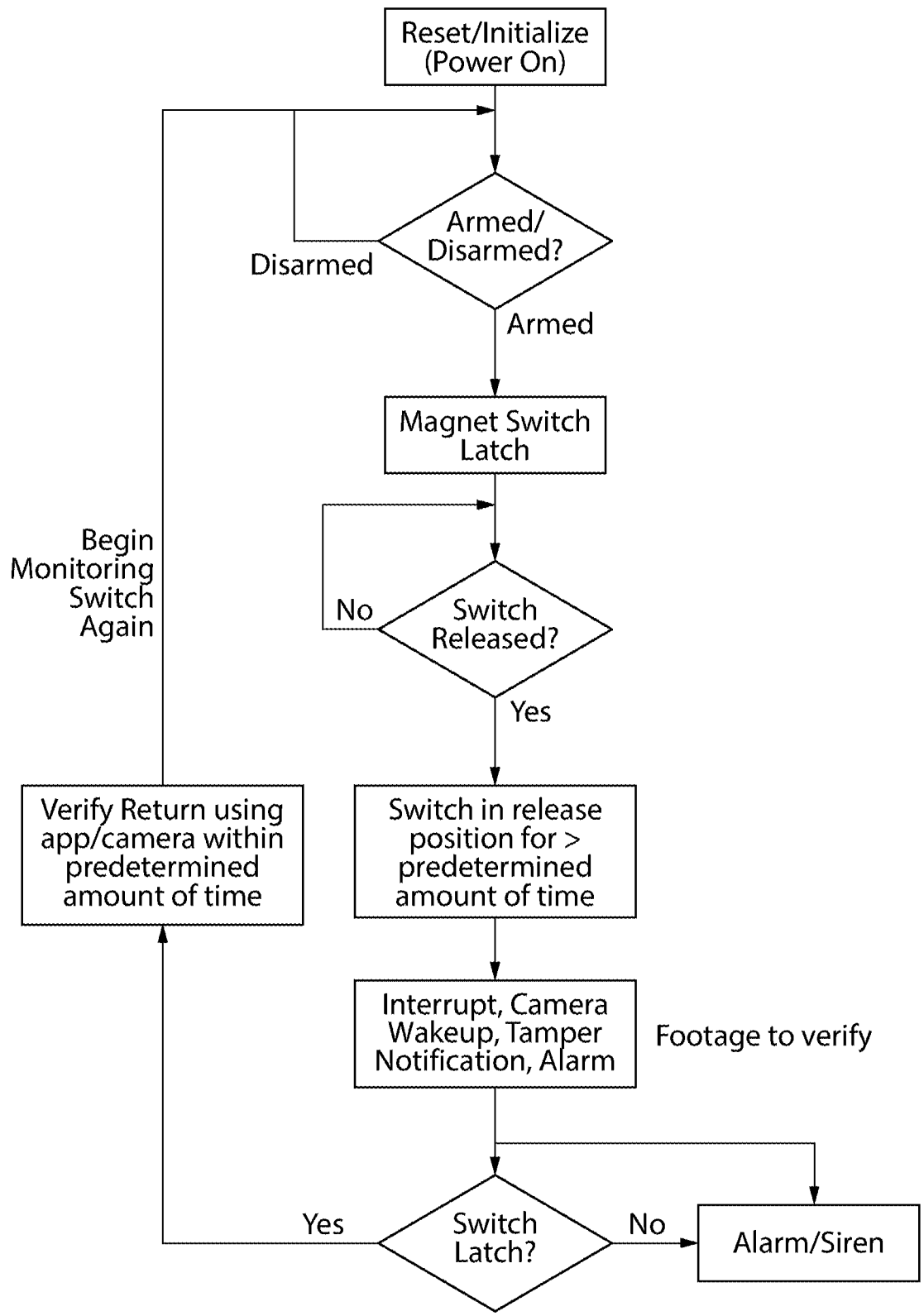
FIG. 5 is an exemplary flowchart of an electronic device accordance with some implementations.

Referring to FIG. 5, a method of detecting a tamper event is shown. In some implementations, switch or sensor 500 alone, or sensor 500 in conjunction with accelerometer 600 may be powered on and armed by a user. For example, at the time of mounting security system 100, the user may arm security system 100, thereby arming sensor 500 and accelerometer 600. In some implementations, sensor 500 alone, or sensor 500 in conjunction with accelerometer 600 may be defaulted to be disarmed. In some implementations, sensor 500 acts like a magnetic switch sensor. When sensor 500 and accelerometer 600 are armed, sensor 500 may detect whether a magnetic field is present based on the distance of head 104 relative to magnet 400 disposed within mounting plate 116.

In some implementations, sensor 500 continues to check for a detection of the magnetic field associated with magnet 400 at frequency of, for example, approximately 20 Hz. In some implementations, sensor 500 continues to check for a detection of the magnetic field associated with magnet 400 at frequency greater than 10 Hz. In some implementations, when sensor 500 no longer detects the magnetic field associated with magnet 400 or detects a deviation from the initial baseline, due to head 104 decoupling from mounting plate 116, sensor 500 may initiate an alarm. In some implementations, sensor 500 only initiates an alarm when sensor 500 does not detect a magnetic field strength value or deviation for greater than a predetermined amount of time. When sensor 500 initiates an alarm, sensor 500 may activate camera module disposed within housing 106, sound an alarm, interrupt a recording function of the camera, or notify the user via an application associated with security system 100.

In some implementations, the camera disposed within housing 106 may begin recording to verify that an intruder is present and may relay this information to an application associated with an electronic device of the user. In some implementations, for the duration that sensor 500 detects that head 104 has been moved due to deviations in the magnetic field strength value detected, sensor 500 may output the alarm. In some implementations, when head 104 is re-coupled to mounting plate 116, sensor 500 may verify that head 104 has been re-coupled by activating the camera or via the application. In some implementations, sensor 500 may begin monitoring deviations again once head 104 is re-coupled.

The terminology used in the description of the various described implementations herein is for the purpose of describing particular implementations only and is not intended to be limiting. As used in the description of the various described implementations and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes", "including", "comprises", and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. An electronic device comprising:
a mounting device configured to couple to a surface, the mounting device including a magnet;
a head removably coupled to the mounting device, the head including a housing; and
a sensor disposed within the housing, the sensor configured to:
detect a first magnetic field strength value associated with the magnet when the head is coupled to the mounting device in a first position relative to the mounting device, the first position defining a first orientation of the sensor relative to the magnet; and
detect a second magnetic field strength value associated with the magnet when the head is coupled to the mounting device in a second position relative to the mounting device, the second position being different from the first position, the second position defining a second orientation of the sensor relative to the magnet that is different from the first orientation.

2. The electronic device of claim 1, wherein the sensor is configured to detect a magnetic field strength value associated with a magnetic field of Earth and configured to detect a change in the magnetic field strength value associated with the magnetic field of the Earth based on movement of the head.

3. The electronic device of claim 1 further comprising:
a camera module disposed within the housing.

4. The electronic device of claim 1, wherein the sensor is configured to detect changes in magnetic fields in multiple axes.

5. The electronic device of claim 1 further comprising:
a speaker communicatively coupled to the sensor, wherein the speaker outputs an audio signal based on a change in the first magnetic field strength value associated with the magnet.

6. The electronic device of claim 1, wherein the sensor is one of a magnetometer, a magnetoresistive sensor, and a Hall effect sensor.

7. The electronic device of claim 1, wherein the magnet assists in removably coupling the head to the mounting device.

8. The electronic device of claim 1, wherein the first magnetic field strength value associated with the head in the first position and the second magnetic field strength value associated with the head in the second position are each non-zero values.

9. The electronic device of claim 1 further comprising:
an accelerometer disposed in the housing.

10. The electronic device of claim 1, wherein the housing is pivotable relative to the mounting device.

11. The electronic device of claim 1, wherein the sensor is configured to detect the first magnetic field strength value at a frequency greater than 10 Hz.

12. The electronic device of claim 1, wherein the sensor is configured to notify an end user when the second magnetic field strength value deviates from the first magnetic field strength value by a predetermined amount.

13. The electronic device of claim 1, wherein the housing is hingedly coupled to a stand, which is coupled to the mounting device, the stand configured to allow the housing to move relative to the stand and the mounting device in at least two degrees of freedom.

14. The electronic device of claim 1, wherein the sensor is configured to:
when the head is in the first position relative to the mounting device, detect a third magnetic field strength value associated with a magnetic field of Earth; and
when the head is in the second position relative to the mounting device and the sensor is unable to detect the second magnetic field strength value associated with the magnet, detect a change in the third magnetic field strength value associated with the magnetic field of the Earth.

15. A security camera comprising:
a camera module;
a mounting plate configured to couple to a surface;
a base assembly coupled to the mounting plate;
a head including a housing, the housing containing the camera module, the housing rotatably and pivotably coupled to the base assembly;
a magnet coupled to the mounting plate; and
a sensor disposed within the head, sensor configured to detect a first magnetic field strength value associated with the magnet when the head is in a first position relative to the mounting plate and configured to detect a second magnetic field strength value associated with the magnet when the head is in a second position relative to the mounting plate, the second position being different than the first position, the first position defining a first orientation of the sensor relative to the magnet, the second position defining a second orientation of the sensor relative to the magnet that is different from the first orientation.

16. A method of detecting a tamper event associated with an electronic device having a head and a mounting device, the method comprising:
detecting, via a sensor disposed within the electronic device, a magnetic field strength value associated with a magnet when the head is in an initial position relative to the mounting device, the initial position defining an orientation of the sensor relative to the magnet;
obtaining, via the sensor, an initial baseline based on the magnetic field strength value when the head is in the initial position; and
detecting, via the sensor, a deviation from the initial baseline based on movement of the head relative to the mounting device, the movement of the head causing a change to the orientation of the sensor relative to the magnet.

17. The method of claim 16 further comprising:
notifying an end user having application associated with the electronic device that the deviation has occurred.

18. The method of claim 16 further comprising:
detecting, via the sensor, the magnetic field strength value at a frequency greater than 10 Hz.

19. The method of claim 16 further comprising:
detecting, via the sensor, a second magnetic field strength value associated with a magnetic field of Earth and a change in the second magnetic field strength value associated with the magnetic field of the Earth based on the movement of the head.

20. The method of claim 16 further comprising:
notifying an end user only when the magnetic field strength value deviates from the initial baseline by a predetermined amount.

* * * * *